United States Patent
Yokoyama et al.

(10) Patent No.: US 10,381,566 B2
(45) Date of Patent: Aug. 13, 2019

(54) ORGANIC CHARGE TRANSPORT LAYER, ORGANIC EL DEVICE, ORGANIC SEMICONDUCTOR DEVICE, AND ORGANIC PHOTOELECTRIC DEVICE

(71) Applicant: NATIONAL UNIVERSITY CORPORATION YAMAGATA UNIVERSITY, Yamagata-shi, Yamagata (JP)

(72) Inventors: Daisuke Yokoyama, Yonezawa (JP); Yasutaka Suzuki, Yonezawa (JP); Wataru Aita, Yonezawa (JP)

(73) Assignee: NATIONAL UNIVERSITY CORPORATION YAMAGATA UNIVERSITY, Yamagata-Shi, Yamagata (JP)

( * ) Notice: Subject to any disclaimer, the term of this patent is extended or adjusted under 35 U.S.C. 154(b) by 56 days.

(21) Appl. No.: 15/736,956

(22) PCT Filed: Jun. 17, 2016

(86) PCT No.: PCT/JP2016/068114
§ 371 (c)(1),
(2) Date: Dec. 15, 2017

(87) PCT Pub. No.: WO2016/204275
PCT Pub. Date: Dec. 22, 2016

(65) Prior Publication Data
US 2018/0366650 A1   Dec. 20, 2018

(30) Foreign Application Priority Data
Jun. 17, 2015   (JP) ................. 2015-121641

(51) Int. Cl.
*H01B 1/12*   (2006.01)
*H01L 51/00*   (2006.01)
(Continued)

(52) U.S. Cl.
CPC .......... *H01L 51/0035* (2013.01); *C09K 11/06* (2013.01); *H01B 1/12* (2013.01);
(Continued)

(58) Field of Classification Search
CPC ... C09K 11/06; H01L 51/0035; H01L 51/004; H01L 51/0043; H01L 51/0058;
(Continued)

(56) References Cited

U.S. PATENT DOCUMENTS 8,178,779 B2 *   5/2012   He .................. H01L 51/0043
                                                        136/263
2012/0126704 A1   5/2012   Blom et al.

FOREIGN PATENT DOCUMENTS

JP   2008-243958 A   10/2008
JP   2010-021422 A   1/2010
(Continued)

OTHER PUBLICATIONS

H. Kakizoe, et al., "Lowering of Surface-Plasmon-Loss in OLED with Low Refractive Index Electron Transport Layer and its Optical Analysis", Proceedings of the 62th Japan Society of Applied Physics Spring Meeting 11a-D3-5, 2015, pp. 1.
(Continued)

*Primary Examiner* — Mark Kopec
*Assistant Examiner* — Jaison P Thomas
(74) *Attorney, Agent, or Firm* — Buchanan, Ingersoll & Rooney PC (57) ABSTRACT

The present invention relates to an organic charge transport layer having a low refractive index, and to an organic EL device, an organic semiconductor device, and an organic photoelectric device which are provided with the organic charge transport layer. An object of the present invention is to provide an organic semiconductor thin film having a dramatically reduced refractive index without impairing conductivity, by mixing a predetermined amount of an electret material into an organic semiconductor material. The organic charge transport layer according to the present invention is characterized by containing an organic semi-
(Continued)

conductor material and an electret material. It is preferable that the organic semiconductor material is a hole transport material and the electret material has a refractive index of 1.5 or lower.

16 Claims, 3 Drawing Sheets (51) Int. Cl.
C09K 11/06 (2006.01)
H01L 51/50 (2006.01)

(52) U.S. Cl.
CPC .......... *H01L 51/004* (2013.01); *H01L 51/006* (2013.01); *H01L 51/0043* (2013.01); *H01L 51/0059* (2013.01); *H01L 51/50* (2013.01); *H01L 51/5056* (2013.01); H01L 51/0058 (2013.01); H01L 51/506 (2013.01); H01L 51/5064 (2013.01); Y02E 10/549 (2013.01)

(58) Field of Classification Search
CPC ... H01L 51/0059; H01L 51/006; H01L 51/50; H01L 51/5056; H01L 51/506; H01L 51/5064; H01B 1/12
See application file for complete search history.

(56) References Cited

FOREIGN PATENT DOCUMENTS

| JP | 2012-510177 A | 4/2012 |
| JP | 2013-084888 A | 5/2013 |
| JP | 2014-032851 A | 2/2014 |
| JP | 2015-022072 A | 2/2015 |
| WO | WO 2012/002245 A1 | 1/2012 |

OTHER PUBLICATIONS

Anne Köhnen, et al., "Enhanced efficiency of multilayer organic light-emitting diodes with a low-refractive index hole-transport layer: An effect of improved outcoupling?", Applied Physics Letters, 2007, pp. 113501-1-113501-3, vol. 91.

Kanchan Saxena, et al., "A review on the light extraction techniques in organic electroluminescent devices", Optical Materials, 2009, pp. 221-233, vol. 32.

L.H. Smith, et al., "Using a low-index host layer to increase emission from organic light-emitting diode structures", ScienceDirect, Organic Electronics, 2006, pp. 490-494, vol. 7.

Daisuke Yokoyama, "Molecular orientation in small-molecule organic light-emitting diodes", Journal of Materials Chemistry, 2011, pp. 19187-19202, vol. 21.

Daisuke Yokoyama, et al., "Wide-Range Refractive Index Control of Organic Semiconductor Films Toward Advanced Optical Design of Organic Optoelectronic Devices", Advanced Materials, 2012, pp. 6368-6373, vol. 24.

International Search Report (PCT/ISA/210) dated Sep. 20, 2016, by the Japanese Patent Office as the International Searching Authority for International Application No. PCT/JP2016/068114.

Written Opinion (PCT/ISA/237) dated Sep. 20, 2016, by the Japanese Patent Office as the International Searching Authority for International Application No. PCT/JP2016/068114.

* cited by examiner

ORGANIC CHARGE TRANSPORT LAYER, ORGANIC EL DEVICE, ORGANIC SEMICONDUCTOR DEVICE, AND ORGANIC PHOTOELECTRIC DEVICE

TECHNICAL FIELD

The present invention relates to an organic charge transport layer with low refractive index, an organic EL device, an organic semiconductor device, and organic photoelectric device that are provided with the organic charge transport layer.

BACKGROUND ART

According to the development of materials and development of devices which are carried out over a long period of time, the internal quantum efficiency of an organic electroluminescence (EL) element reaches almost 100%, and a further dramatic improvement of external quantum efficiency (EQE) depends only on how the outcoupling efficiency can be enhanced. As a technique for enhancing the outcoupling efficiency, a conventional method like using microlens or substrate with high refractive index is widely known (for example, Non Patent Literature 1), but it has a problem that cost required for the process or cost for substrate member is high. Furthermore, in recent years, a method of limiting light emission from transition dipole to the direction perpendicular to substrate by horizontal alignment of light emitting molecules is widely used (for example, Non Patent Literature 2). However, in terms of enhancement of the outcoupling efficiency, there is still large room for improvement, and thus a further improvement is in need.

Meanwhile, although experimental research for widely varying the refractive index of each semiconductor layer so as to control the light propagation within a device or the outcoupling efficiency has been widely carried out for a Group III-V inorganic semiconductor device like LED and laser diode, there are only limited examples of a study on organic semiconductor device (Patent Literature 1 and Non Patent Literature 3). There is a case in which a method of controlling the light propagation or outcoupling efficiency by adding an inorganic material layer on an outside of an organic semiconductor device is used. However, as the process cost is high and the refractive index inside a device cannot be directly controlled, there is also a problem that it is difficult to carry out the effective control of light propagation or outcoupling efficiency. There is also a problem that, when an inorganic material layer is formed on top of an organic semiconductor layer, it tends to damage the organic semiconductor layer as a lower layer.

Theoretical prediction stating that the outcoupling efficiency of an organic EL element can be enhanced by lowering the refractive index of an organic semiconductor thin film has been reported before (Patent Literature 1 and Non Patent Literatures 4 to 6). However, the biggest challenge for exhibiting the high effect is how to achieve a film with refractive index varying in broad range without impairing the electric property.

The amorphous organic semiconductor thin film used for an organic EL element or the like consists of π-conjugated organic materials with high molar refraction, and it is generally known to have refractive index of 1.7 to 1.8 or so in transparent region. However, because those of π-conjugated organic materials have a narrow range for controlling the refractive index, a significant enhancement of outcoupling efficiency cannot be expected from a constitution having simple organic semiconductor materials. Furthermore, according to the current state, the light propagation inside a device cannot be controlled by refractive index of a semiconductor itself like an inorganic semiconductor device, and thus it is necessary to use only an inorganic material layer (e.g., metal, conductive oxide, and insulating dielectric material) outside an element for controlling the light propagation. However, only with the control based on a member outside a device, the degree of freedom of optical design is low so that the light propagation inside a device cannot be sufficiently controlled. As such, development of an organic semiconductor material enabling control of refractive index is needed.

CITATION LIST

Patent Literature

Patent Literature 1: JP 2014-32851 A

Non Patent Literature

Non Patent Literature 1: K. Saxena et al., Opt. Mater. 32, 221 (2009)
Non Patent Literature 2: D. Yokoyama, J. Mater. Chem. 21, 19187 (2011)
Non Patent Literature 3: D. Yokoyama et al., Adv. Mater. 24, 6368 (2012)
Non Patent Literature 4: L. H. Smith et al., Org. Electron, 7, 490 (2006)
Non Patent Literature 5: A. Koehnen et al., Appl. Phys. Lett. 91, 113501 (2007)
Non Patent Literature 6: Kakizoe et al., The Japan Society of Applied Physics, Spring Meeting 2015, Abstract 11a-D3-5

SUMMARY OF INVENTION

Technical Problem

An object of the present invention is to provide an organic semiconductor thin film having a dramatically reduced refractive index of film without impairing conductivity, by mixing a predetermined amount of an electret material into an organic semiconductor material.

Solution to Problem

The present invention is to solve the aforementioned problems of a related art, and it consists of the followings.
The organic charge transport layer according to the present invention is characterized by containing an organic semiconductor material and an electret material.
It is preferable that the organic semiconductor material is a hole transport material.
It is preferable that the electret material has a refractive index of 1.5 or lower.
It is preferable that the electret material is at least one selected from the group consisting of:
  polypropylene;
  polytetrafluoroethylene (PTFE);
  tetrafluoroethylene-hexafluoropropylene copolymer (FEP);
  fluorine-based copolymer containing a 2,2-bistrifluoromethyl-4,5-difluoro-1,3-dioxol structural unit represented by the following formula (1) and a tetrafluoroethylene structural unit represented by the following formula (2); and

[Chem. 1]

fluorine-based polymer containing a structural unit represented by the following formula (3).

[Chem. 2]

With the proviso that, in the formula (3), X represents a hydrogen atom, a fluorine atom, a chlorine atom, a trifluoromethyl group, or a trifluoromethoxy group, Y represents an oxygen atom, a difluoromethylene group ($CF_2$), or a tetrafluoroethylene group ($C_2F_4$), $R^1$ and $R^2$ each independently represent a fluorine atom, a trifluoromethyl group, or a pentafluoroethyl group and $R^1$ and $R^2$ may be linked to each other to form a 5-membered ring or a 6-membered ring containing 4 or more fluorine atoms, and n represents an integer of 1 or more. From the viewpoint of the film forming property, n is preferably 10 or more.

The organic EL device, organic semiconductor device, or organic photoelectric device of the present invention is characterized in that the aforementioned organic charge transport layer is used therein.

Advantageous Effects of Invention

According to the present invention, by mixing a predetermined amount of an electret material into an organic semiconductor material, refractive index of an organic charge transport layer or an organic charge transport film can be dramatically reduced without impairing conductivity, and an organic semiconductor thin film by which outcoupling efficiency of an organic EL element is enhanced by 10 to 30% based on theoretical calculation can be provided.

DESCRIPTION OF EMBODIMENTS

Hereinbelow, the present invention is explained in greater detail.

[Organic Charge Transport Layer]

The organic charge transport layer of the present invention contains an organic semiconductor material and an electret material.

The organic semiconductor material is an organic compound which exhibits a semiconductor-like electric property.

Refractive index of an organic semiconductor material for visible light is generally 1.7 to 1.8 or so in a wavelength region in which the material has no light absorption. Furthermore, as a substrate which is generally used for an organic photoelectric device, glass has refractive index of about 1.5 for visible light.

Among the organic semiconductor materials, the material responsible for charge transport is mainly divided into a hole transport material which receives hole injection from an anode and transports a hole and an electron transport material which receives electron injection from a cathode and transports an electron.

Representative examples of a hole transport material include the compounds that are shown below (α-NPD and TAPC). Refractive index of α-NPD and TAPC against vertical incident light with a wavelength of 532 nm is 1.82 and 1.68, respectively.

[Chem. 3]

α-NPD

[Chem. 4]

TAPC

Representative examples of an electron transport material include the compounds that are shown below (Alq$_3$, PBD, and OXD7). Refractive index of Alq$_3$, PBD, and OXD7 against vertical incident light with a wavelength of 532 nm is 1.74, 1.67, and 1.67, respectively.

[Chem. 5]

Alq$_3$

[Chem. 6]

PBD

[Chem. 7]

OXD7

As for the organic semiconductor material of the present invention, any one of an electron transport material and a hole transport material can be used. However, from the viewpoint that many of the electron transport materials accumulate a negative charge in electret material, a hole transport material which provides a charge different from it is preferable, and α-NPD and TAPC are more preferable.

The organic semiconductor material can be produced by a known method, or a commercially available product can be used. Examples of the commercially available product include α-NPD (manufactured by Lumtec, LT-E101) and TAPC (manufactured by Lumtec, LT-N137).

Furthermore, "α-NPD" is an abbreviation of 4,4'-bis[N-(1-naphthyl)-N-phenylamino]biphenyl and "TAPC" is an abbreviation of 4,4-cyclohexylidene bis[N,N-bis(4-methylphenyl)benzeneamine.

The electret material indicates a material which can, when solidified between electrodes applied with direct current voltage followed by removal of the electrodes, hold a charge according to charging and maintain the charge for a long period of time.

The electret material in the present invention is not particularly limited as long as it is a material which has the above characteristics and can hold charges semi-permanently. However, from the viewpoint of controlling the refractive index, those with refractive index of 1.5 or less are preferable. Those with refractive index of 1.4 or less are more preferable, and those with refractive index of 1.2 to 1.4 are particularly preferable. Furthermore, although those with even lower refractive index are acceptable, obtainment of such materials is practically difficult.

As described in the above, the refractive index of an organic semiconductor material is generally 1.7 to 1.8 or so in a wavelength region in which the material has no light absorption. By mixing a predetermined amount of an electret material with refractive index of 1.5 or less into an organic semiconductor material with such refractive index, the refractive index of an organic charge transport layer to be obtained can be reduced, and by having a refractive index close to that of a quartz glass substrate or an ITO film-attached glass substrate (refractive index: about 1.5) that is adjacent to the organic charge transport layer, total reflection occurring at an interface between an organic charge transport layer and a glass substrate as caused by a difference in refractive index between the organic charge transport layer and glass substrate can be avoided, and also light extraction rate can be enhanced.

It is preferable that the electret material is specifically at least one selected from the group consisting of:
polypropylene;
polytetrafluoroethylene (PTFE);
tetrafluoroethylene-hexafluoropropylene copolymer (FEP);
fluorine-based copolymer containing a 2,2-bistrifluoromethyl-4,5-difluoro-1,3-dioxol structural unit represented by the following formula (1) and a tetrafluoroethylene structural unit represented by the following formula (2); and

[Chem. 8]

(1)

(2)

fluorine-based polymer containing a structural unit represented by the following formula (3).

[Chem. 9]

(3)

Examples of the fluorine-based copolymer containing a 2,2-bistrifluoromethyl-4,5-difluoro-1,3-dioxol structural unit represented by the above formula (1) and a tetrafluoroethylene structural unit represented by the above formula (2) include a fluorine-based copolymer which contains a 2,2-bistrifluoromethyl-4,5-difluoro-1,3-dioxol structural unit represented by the above formula (1) at 65% by mol and a tetrafluoroethylene structural unit represented by the above formula (2) at 35% by mol and a fluorine-based copolymer which contains a 2,2-bistrifluoromethyl-4,5-difluoro-1,3-dioxol structural unit represented by the above formula (1) at 87% by mol and a tetrafluoroethylene structural unit represented by the above formula (2) at 13% by mol. Specific examples thereof include Teflon (registered trademark) AF1600 (manufactured by Du Pont; refractive index of 1.31) and Teflon (registered trademark) AF2400 (manufactured by Du Pont; refractive index of 1.29). Furthermore, total of the 2,2-bistrifluoromethyl-4,5-difluoro-1,3-dioxol structural unit represented by the above formula (1) and the tetrafluoroethylene structural unit represented by the above formula (2) is 100% by mol.

[Chem. 10]

AF1600 : x = 65 mol %, y = 35 mol %
AF2400 : x = 87 mol %, y = 13 mol %

Furthermore, in the formula (3), X represents a hydrogen atom, a fluorine atom, a chlorine atom, a trifluoromethyl group, or a trifluoromethoxy group, Y represents an oxygen atom, a difluoromethylene group ($CF_2$), or a tetrafluoroethylene group ($C_2F_4$), $R^1$ and $R^2$ each independently represent a fluorine atom, a trifluoromethyl group, or a pentafluoroethyl group and $R^1$ and $R^2$ may be linked to each other to form a 5-membered ring or a 6-membered ring containing 4 or more fluorine atoms, and n represents an integer of 1 or more. From the viewpoint of the film forming property, n is preferably 10 or more. Examples of the 5-membered ring or 6-membered ring containing fluorine atom include a heterocycle containing —$CF(CF_3)O(CF_2)_3$— structure.

Specific examples of the compound containing the structural unit represented by the formula (3) include a compound in which both $R^1$ and $R^2$ are a fluorine atom, X is a fluorine atom, and Y is a difluoromethylene group ($CF_2$), for example, CYTOP (trade name: manufactured by AGC (Asahi Glass Co., Ltd)).

In the formula (3), n is preferably an integer of 5 or more, and more preferably an integer of 10 or more. Namely, the compound containing the structural unit represented by the formula (3) can be either a so-called oligomer having several repeating units or a polymer having higher number of repeating units.

Among the above electret materials, an amorphous material is more preferable. From the viewpoint of having a low refractive index and an amorphous property, AF1600, AF2400, and CYTOP are more preferable. From the viewpoint of having a low refractive index, AF1600 and AF2400 are particularly preferable.

As for the method for forming an organic charge transport layer, it is possible that an organic semiconductor material and an electret material are separately put on a different cell in a vapor deposition apparatus, and by resistance heating, they are vapor-codeposited on a quartz glass substrate or ITO glass generally at vacuum level of $10^{-4}$ Pa or less, or an organic semiconductor material is admixed with an electret material followed by film forming by a process like sputtering. It is also possible that an organic semiconductor material and an electret material are dissolved or dispersed in an organic solvent and formed into a film by a wet process like inkjet method, casting method, dip coating method, bar coating method, blade coating method, roll coating method, gravure coating method, flexographic printing method, and spray coating method.

In the organic charge transport layer, the electret material is generally mixed, relative to the organic semiconductor material (100% by volume), at a ratio of more than 0% by volume and 65% by volume or less, preferably 20% by volume or more and 65% by volume or less, more preferably 40% by volume or more and 60% by volume or less, and particularly preferably 50% by volume or more and 55% by volume or less. As the mixing ratio of electret material relative to organic semiconductor material is within the aforementioned range, the refractive index at a wavelength of 550 nm becomes most close to 1.5, and it becomes a value which is close to the refractive index of quartz glass or ITO film-attached glass substrate.

Figure 2:
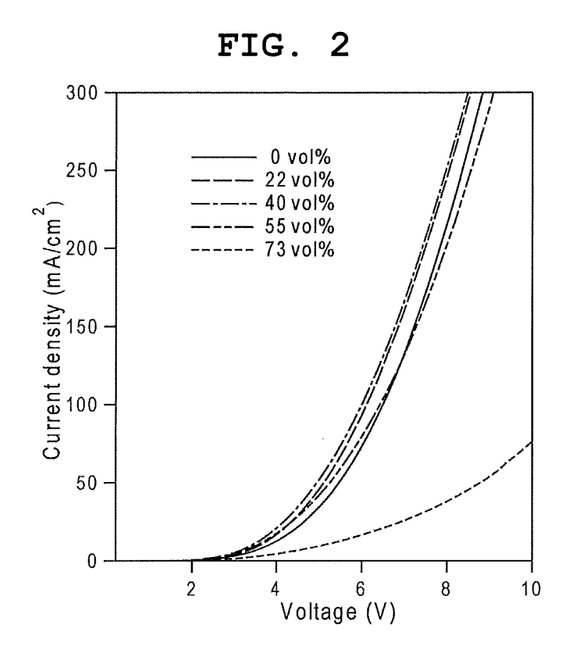
FIG. 2 is a drawing illustrating the current density-voltage characteristics when α-NPD and AF1600 were vapor-codeposited at a ratio of 100:0 (i.e., α-NPD only), 78:22, 60:40, 45:55, or 27:73 (all in volume ratio).
Figure 4:
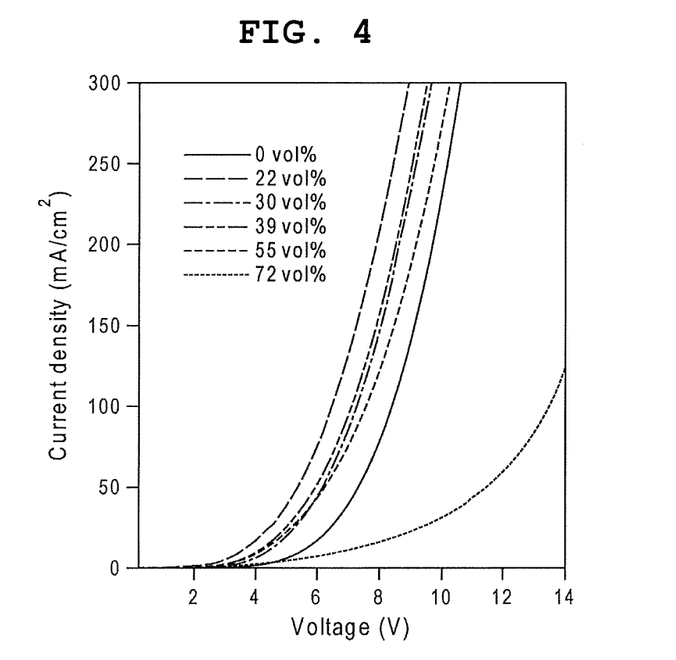
FIG. 4 is a drawing illustrating the current density-voltage characteristics when TAPC and AF1600 were vapor-codeposited at a ratio of 100:0 (i.e., TAPC only), 78:22, 70:30, 61:39, 45:55, or 28:72 (all in volume ratio).

Meanwhile, when content of an electret material is 0 to 55% by volume relative to an organic semiconductor material (100% by volume), the current density at voltage application is not reduced compared to a case in which the content is 0% by volume (see FIGS. 2 and 4). However, when it is close to 70% by volume, specifically, higher than 73% by volume, the amount of an electret material becomes excessive so that the current density at voltage application is greatly reduced, i.e., conductivity is reduced, compared to a case in which the content is 0% by volume. As such, in order to maintain the conductivity while reducing the refractive index, the content of an electret material relative to an organic semiconductor material is most preferably 50 to 55% by volume.

[Organic EL Device, Organic Semiconductor Device, Organic Photoelectric Device]

In all of the organic EL device, organic semiconductor device, or organic photoelectric device of the present invention, the aforementioned organic charge transport layer is used. As for the organic photoelectric device, it is not particularly limited as long as it is an organic semiconductor device which has a layer playing a role of transporting holes or electrons. Examples thereof include an organic EL device and an organic thin film photovoltaic cell.

Examples of the organic photoelectric device which is mentioned in the present invention include a device that is provided with a pair of electrodes in which at least one layer of the organic charge transport layer of the present invention is sandwiched between the pair of electrodes.

Furthermore, in a case in which an organic device requires a translucent layer like light emitting layer and power generation layer, it is possible to have, in addition to the organic charge transport layer, the translucent layer sandwiched between a pair of electrodes having a transparent conductive electrode and a counter electrode opposing the transparent conductive electrode and the pair of electrodes.

The method for having the organic charge transport layer of the present invention sandwiched in an organic EL device, an organic semiconductor device, or an organic photoelectric device is not particularly limited. For example, it is sufficient to mount in the aforementioned device, by a known method, a vapor-codeposited film that is obtained by vapor codeposition on an ITO film-coated glass substrate according to the method of Examples.

Because the organic photoelectric device of the present invention is provided with the organic charge transport layer, by controlling the refractive index, high light emission efficiency can be achieved as an organic EL element, and high conversion efficiency can be achieved as an organic thin film photovoltaic cell, for example, and thus it can be obtained as an organic semiconductor device having high performance.

EXAMPLES

Hereinbelow, the present invention is more specifically explained based on Examples. However, the present invention is not limited to the following Examples.

Example 1

1. Evaluation of Refractive Index
1-1. Sample Preparation

A silicon substrate cut to have about 2 cm square was subjected to ultrasonic cleaning using neutral detergent, acetone, and isopropanol. After further cleaning by boiling in isopropanol, adhered matters on a surface of the substrate were removed by an ozone treatment. The substrate was placed in a vacuum vapor deposition apparatus followed by vacuum treatment at pressure of $10^{-4}$ Pa or less. By using α-NPD as an organic semiconductor material and Teflon (registered trademark) AF1600 (manufactured by Du Pont) as an electret material such that the ratio between α-NPD and AF1600 is 100:0, 78:22, 60:40, 45:55, 27:73, or 0:100 (all in volume ratio), performing resistance heating in a vacuum vapor deposition apparatus, and performing vapor codeposition, each layer with a thickness of about 100 nm was produced. The total deposition rate for the two materials was set at 2.0 Å/s.

1-2. Measurement

By using multiple angle of incidence spectroscopic ellipsometer (M-2000U: manufactured by J. A. Woollam Co. Inc.) and modifying the light incidence angle by 5 degrees within a range of 45 to 75 degrees, the measurement was carried out. At each angle, Ψ and Δ, which are ellipsometric parameters, were measured at an interval of about 1.6 nm within a wavelength range of 245 to 1000 nm. By using the measurement data, the imaginary part of a dielectric function of an organic semiconductor was expressed by an overlap of a Gaussian function, and by performing a fitting analysis under the conditions at which Kramers-Kronig relation is satisfied, the refractive index and extinction coefficient of a layer for light with each wavelength were obtained.

Figure 1:
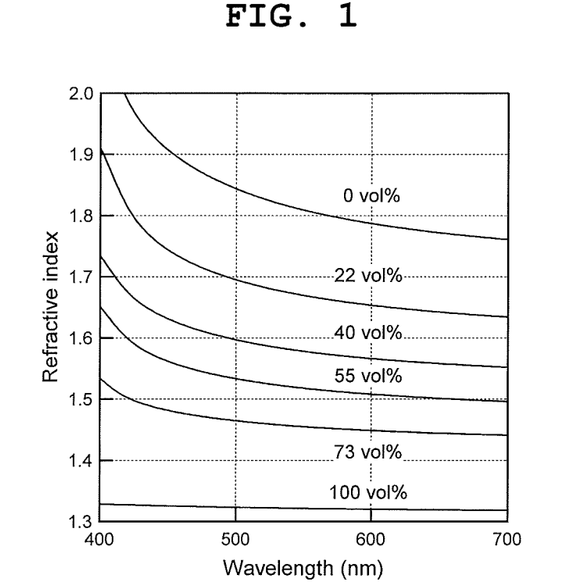
FIG. 1 is a drawing illustrating the relationship of wavelength—refractive index when α-NPD and AF1600 were vapor-codeposited at a ratio of 100:0 (i.e., α-NPD only), 78:22, 60:40, 27:73, or 0:100 (i.e., AF1600 only) (all in volume ratio).

A change in refractive index at a wavelength of 550 nm according to mixing ratio of AF1600 relative to α-NPD was shown in Table 1 and FIG. 1.

TABLE 1

| α-NPD:AF1600 (volume ratio) | Refractive Index (@ wavelength of 550 nm) |
|---|---|
| 100:1 | 1.81 |
| 78:22 | 1.67 |
| 60:40 | 1.58 |
| 45:55 | 1.52 |
| 27:73 | 1.46 |
| 0:100 | 1.32 |

From Table 1 and FIG. 1, it was confirmed that the refractive index of a vapor-codeposited film monotonically decreases in accordance with an increase in mixing volume ratio of AF1600 with low refractive index.

2. Evaluation of Current-Voltage Characteristics
2-1. Fabrication of Element

As a substrate for fabricating an element for evaluation, a glass substrate on which ITO (indium tin oxide) is formed as a film with band shape having 2 mm width was used. The substrate was subjected to ultrasonic cleaning using neutral detergent, acetone, and isopropanol. After further cleaning by boiling in isopropanol, adhered matters on a surface of the ITO film were removed by an ozone treatment. The substrate was placed in a vacuum vapor deposition apparatus followed by vacuum treatment at pressure of $10^{-4}$ Pa or less. Thereafter, molybdenum trioxide was subjected to resistance heating in a vacuum vapor deposition apparatus, and as a hole injection layer, deposited as 5 nm film on the substrate at vapor deposition rate of 0.1 nm/s. Thereafter, α-NPD as an organic semiconductor material and AF1600 as an electret material were subjected to resistance heating in a vacuum vapor deposition apparatus such that the ratio between α-NPD and AF1600 is 100:0, 78:22, 60:40, 45:55, or 27:73 (all in volume ratio), and by performing vapor codeposition, each layer with a thickness of about 100 nm was laminated. Furthermore, aluminum was vapor-deposited by resistance heating to have a band shape having 2 mm width, thus yielding an element for evaluation. As a result, the 2 mm×2 mm in which ITO having 2 mm width and aluminum having 2 mm width are crossed over each other becomes an element area.

2-2. Measurement

With application of voltage by using SourceMeter (Keithley2401; Keithley Instruments) while having the ITO side as an anode and the aluminum side as a cathode, current flowing in the element was measured for each voltage. The results are shown in FIG. 2.

Till to have the AF1600 mixing ratio of 55% by volume, a decrease in electric property was not exhibited, and it was shown that the low refractive index can be achieved without impairing the electric property. As such, it was suggested that a triphenylamine-based hole transport material like α-NPD is effective for the dramatic reduction of refractive index.

Figure 5:
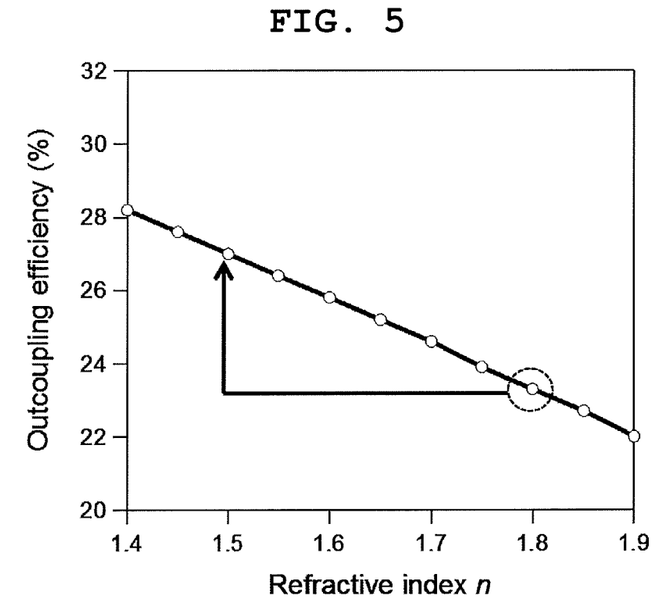
FIG. 5 is a drawing illustrating the outcoupling efficiency of an organic EL device ITO/α-NPD:AF1600 mixture film (30 nm)/α-NPD (20 nm)/$Alq_3$ (50 nm)/LiF (1 nm)/Al (100 nm), i.e., result calculated by using the refractive index of each layer and experimental values of a light emission spectrum and based on theoretical optical calculation, in which the refractive index of α-NPD:AF1600 mixture film (30 nm) is varied. As shown by the arrow (→), compared to the outcoupling efficiency when the refractive index is 1.8, the outcoupling efficiency is enhanced by reducing the refractive index to 1.5 using the organic charge transport layer of the present invention.

3. Theoretical Calculation of Outcoupling Efficiency (i) The outcoupling efficiency of an organic EL device ITO/α-NPD:AF1600 mixture film (30 nm)/α-NPD (20 nm)/Alq$_3$ (50 nm)/LiF (1 nm)/Al (100 nm) was calculated by using the refractive index of each layer and experimental values of a light emission spectrum and based on theoretical optical calculation, in which the refractive index is varied based on the mixing ratio of α-NPD:AF1600 mixture film (30 nm). The results are shown in FIG. 5. The value with refractive index of 1.8 corresponds to the outcoupling efficiency of the device ITO/α-NPD (50 nm)/Alq$_3$ (50 nm)/LiF (1 nm)/Al (100 nm) in which a common layer is used. Compared to the outcoupling efficiency of 23.3% with refractive index of 1.8, it was shown that, by reducing the refractive index to 1.5 using the low refractive index charge transport layer of the present invention, the outcoupling efficiency increased to 27.0%, showing an enhancement of 1.16 times.

Figure 6:
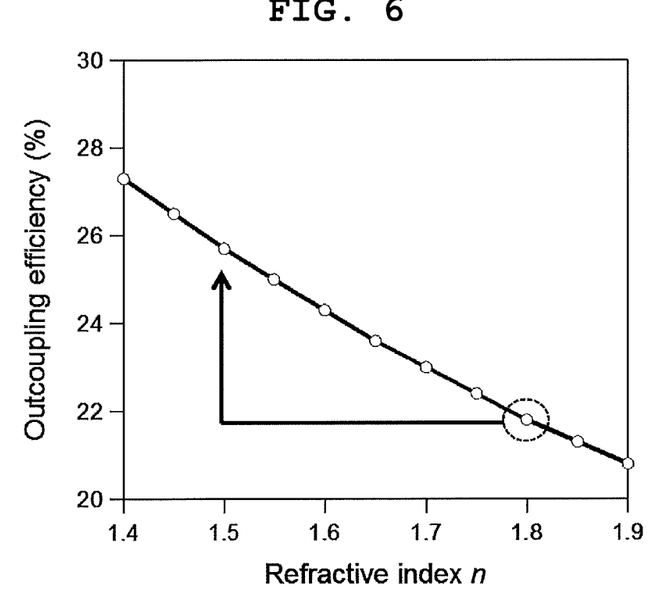
FIG. 6 is a drawing illustrating the outcoupling efficiency of an organic EL device ITO/$CsCo_3$ (1 nm)/$Alq_3$ (50 nm)/α-NPD (20 nm)/α-NPD:AF1600 mixture film (30 nm)/$MoO_3$ (5 nm)/Al (100 nm), i.e., result calculated by using the refractive index of each layer and experimental values of a light emission spectrum and based on theoretical optical calculation, in which the refractive index of α-NPD:AF1600 mixture film (30 nm) is varied. As shown by the arrow (→), compared to the outcoupling efficiency when the refractive index is 1.8, the outcoupling efficiency is enhanced by reducing the refractive index to 1.5 using the organic charge transport layer of the present invention.

(ii) The outcoupling efficiency of an organic EL device ITO/CsCo$_3$ (1 nm)/Alq$_3$ (50 nm)/α-NPD (20 nm)/α-NPD: AF1600 mixture film (30 nm)/MoO$_3$ (5 nm)/Al (100 nm) was calculated by using the refractive index of each layer and experimental values of a light emission spectrum and based on theoretical optical calculation, in which the refractive index is varied based on the mixing ratio of α-NPD: AF1600 mixture film (30 nm). The results are shown in FIG. 6. The value with refractive index of 1.8 corresponds to the outcoupling efficiency of the device ITO/CsCo$_3$ (1 nm)/Alq$_3$ (50 nm)/α-NPD (50 nm)/MoO$_3$ (5 nm)/Al (100 nm) in which a common layer is used. Compared to the outcoupling efficiency of 21.8% with refractive index of 1.8, it was shown that, by reducing the refractive index of organic charge transport layer to 1.5 using the mixture film of the present invention, the outcoupling efficiency increased to 25.7%, showing an enhancement of 1.18 times.

Example 2

1. Evaluation of Refractive Index
1-1. Sample Preparation

Vapor codeposition was carried out in the same manner as Example 1 except that, with regard to Example 1, TAPC was used as an organic semiconductor material and TAPC and AF1600 were used such that their ratio was 100:0, 78:22, 70:30, 61:39, 45:55, 28:72, or 0:100. As a result, a layer with thickness of about 100 nm was produced.

1-2. Measurement

The refractive index was measured in the same manner as Example 1 by using the vapor deposited film obtained in 1-1.

Figure 3:
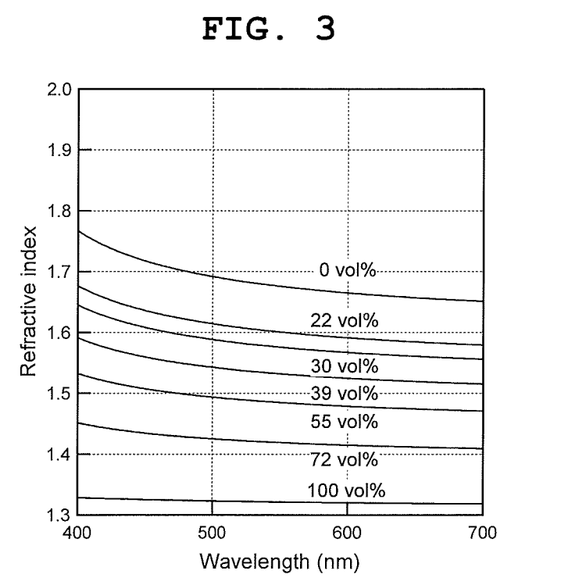
FIG. 3 is a drawing illustrating the relationship of wavelength—refractive index when TAPC and AF1600 were vapor-codeposited at a ratio of 100:0 (i.e., TAPC only), 78:22, 70:30, 61:39, 45:55, 28:72, or 0:100 (i.e., AF1600 only) (all in volume ratio).

A change in the refractive index at a wavelength of 550 nm according to the mixing ratio of AF1600 relative to TAPC is shown in Table 2 and FIG. 3.

TABLE 2

| TAPC:AF1600 (volume ratio) | Refractive Index (@ wavelength of 550 nm) |
|---|---|
| 100:0 | 1.67 |
| 78:22 | 1.60 |
| 70:30 | 1.58 |
| 61:39 | 1.53 |
| 45:55 | 1.48 |
| 28:72 | 1.42 |
| 0:100 | 1.32 |

From Table 2 and FIG. 3, it was confirmed that the refractive index of a vapor-codeposited film monotonically decreases in accordance with an increase in mixing volume ratio of AF1600 with low refractive index.

2. Evaluation of Current-Voltage Characteristics
2-1. Fabrication of Element

An element for evaluation was fabricated in the same manner as Example 1 except that, with regard to Example 1, TAPC was used as an organic semiconductor material and TAPC and AF1600 were used such that their ratio was 100:0, 78:22, 70:30, 61:39, 45:55, or 28:72 (all in volume ratio).

2-2. Measurement

By using the element for evaluation which was obtained in above 2-1, current flowing in the element was measured for each voltage in the same manner as Example 1.

The results are shown in FIG. 4.

Till to have the AF1600 mixing ratio of 55% by volume, a decrease in electric property was not exhibited, and it was shown that the low refractive index can be achieved without impairing the electric property.

From the results of Examples 1 and 2, it was found that, by mixing about 55% by volume of AF1600 in triphenylamine-based hole transport material like α-NPD and TAPC, a hole transport layer with ultralow refractive index which has refractive index of about 1.5 at a wavelength of 550 nm can be achieved.

As such, it was suggested that the technique of mixing a predetermined amount of an electret material like AF1600 into a triphenylamine-based hole transport material is effective for the dramatic reduction of refractive index of a hole transport layer.

Furthermore, it was also suggested from the results of Examples 1 and 2 that AF1600 has, as a property of an electret material, a possibility of holding negative charges and not suppressing hole current while being an insulator.

INDUSTRIAL APPLICABILITY

The organic charge transport layer of the present invention can be appropriately used for a control panel or an information display panel of various electronic instruments as an organic EL device, and it can be also appropriately used for various organic photoelectric devices of which device property is affected by refractive index.

The invention claimed is:

1. An organic charge transport layer comprising an organic semiconductor material and an electret material,
wherein the electret material is at least one selected from the group consisting of:
polypropylene;
polytetrafluoroethylene (PTFE);
tetrafluoroethylene-hexafluoropropylene copolymer (FEP);
fluorine-based copolymer containing a 2,2-bistrifluoromethyl-4,5-difluoro-1,3-dioxol structural unit represented by the following formula (1) and a tetrafluoroethylene structural unit represented by the following formula (2); and (1)

fluorine-based polymer containing a structural unit represented by the following formula (3)

(in the formula (3), X represents a hydrogen atom, a fluorine atom, a chlorine atom, a trifluoromethyl group, or a trifluoromethoxy group, Y represents an oxygen atom, a difluoromethylene group, or a tetrafluoroethylene group, $R^1$ and $R^2$ each independently represent a fluorine atom, a trifluoromethyl group, or a pentafluoroethyl group and $R^1$ and $R^2$ may be linked to each other to form a 5-membered ring or a 6-membered ring containing 4 or more fluorine atoms, and n represents an integer of 1 or more).

2. The organic charge transport layer according to claim 1, wherein the organic semiconductor material is a hole transport material.

3. The organic charge transport layer according to claim 2, wherein the electret material has a refractive index of 1.5 or lower.

4. An organic EL device using the organic charge transport layer according to claim 3.

5. An organic semiconductor device using the organic charge transport layer according to claim 3.

6. An organic photoelectric device using the organic charge transport layer according to claim 3.

7. An organic EL device using the organic charge transport layer according to claim 2.

8. An organic semiconductor device using the organic charge transport layer according to claim 2.

9. An organic photoelectric device using the organic charge transport layer according to claim 2.

10. The organic charge transport layer according to claim 1, wherein the electret material has a refractive index of 1.5 or lower.

11. An organic EL device using the organic charge transport layer according to claim 10.

12. An organic semiconductor device using the organic charge transport layer according to claim 10.

13. An organic photoelectric device using the organic charge transport layer according to claim 10.

14. An organic EL device using the organic charge transport layer according to claim 1.

15. An organic semiconductor device using the organic charge transport layer according to claim 1.

16. An organic photoelectric device using the organic charge transport layer according to claim 1.

* * * * *